(12) United States Patent (10) Patent No.: US 7,868,388 B2
Petti (45) Date of Patent: Jan. 11, 2011

(54) EMBEDDED MEMORY IN A CMOS CIRCUIT AND METHODS OF FORMING THE SAME

(75) Inventor: Christopher J. Petti, Mountain View, CA (US)

(73) Assignee: SanDisk 3D LLC, Milpitas, CA (US)

( * ) Notice: Subject to any disclaimer, the term of this patent is extended or adjusted under 35 U.S.C. 154(b) by 194 days.

(21) Appl. No.: 11/669,850

(22) Filed: Jan. 31, 2007

(65) Prior Publication Data

US 2008/0179685 A1 Jul. 31, 2008

(51) Int. Cl.
*H01L 29/76* (2006.01)

(52) U.S. Cl. .................... 257/367; 257/369; 257/594; 257/910; 257/E27.103; 257/E29.226; 365/105; 365/115; 365/175

(58) Field of Classification Search ............... 257/368, 257/E27.016, 367, 369, 594, 910, E27.103, 257/E29.226; 365/105, 115, 175
See application file for complete search history.

(56) References Cited

U.S. PATENT DOCUMENTS

| | | | | |
|---|---|---|---|---|
| 3,611,319 A | * | 10/1971 | Hyatt | .......................... 365/105 |
| 4,266,235 A | | 5/1981 | Herbst et al. | |
| 4,499,557 A | * | 2/1985 | Holmberg et al. | ........... 365/163 |
| 4,903,189 A | * | 2/1990 | Ngo et al. | ................... 363/127 |
| 5,736,421 A | | 4/1998 | Shimomura et al. | |
| 5,793,077 A | | 8/1998 | Tseng | |
| 5,869,845 A | | 2/1999 | Vander Wagt et al. | |
| 5,943,264 A | | 8/1999 | Fournel et al. | |
| 6,034,882 A | * | 3/2000 | Johnson et al. | ............. 365/103 |
| 6,472,263 B1 | | 10/2002 | Noble | |
| 6,501,139 B1 | | 12/2002 | Petti | |
| 6,888,750 B2 | | 5/2005 | Walker et al. | |
| 6,946,719 B2 | | 9/2005 | Petti et al. | |
| 6,952,030 B2 | | 10/2005 | Herner et al. | |
| 6,990,016 B2 | | 1/2006 | King | |
| 7,129,538 B2 | | 10/2006 | Lee et al. | |
| 7,410,838 B2 | | 8/2008 | Ang | |
| 2001/0051414 A1 | * | 12/2001 | Kanaya et al. | .............. 438/386 |
| 2002/0027822 A1 | | 3/2002 | Candelier et al. | |
| 2002/0031887 A1 | | 3/2002 | Harshfield | |
| 2002/0079553 A1 | * | 6/2002 | Cleeves | ...................... 257/530 |
| 2002/0167091 A1 | * | 11/2002 | Iwasaki et al. | .............. 257/765 |
| 2003/0173669 A1 | * | 9/2003 | Shau | .......................... 257/758 |

(Continued)

FOREIGN PATENT DOCUMENTS

WO WO 99/57750 11/1999

OTHER PUBLICATIONS

Johnson et al., "512-Mb PROM with a Three-Dimensional Array of Diode/Antifuse Memory Cells", Nov. 2003, IEEE Journal of Solid-State Circuits, vol. 38, No. 11, pp. 1920-1928.

(Continued)

*Primary Examiner*—Tu-Tu V Ho
(74) *Attorney, Agent, or Firm*—Dugan & Dugan, PC

(57) ABSTRACT

In some aspects, a memory circuit is provided that includes (1) a two-terminal memory element formed on a substrate; and (2) a CMOS transistor formed on the substrate and adapted to program the two-terminal memory element. The two-terminal memory element is formed between a gate layer and a first metal layer of the memory circuit. Numerous other aspects are provided.

30 Claims, 12 Drawing Sheets

U.S. PATENT DOCUMENTS

| | | | |
|---|---|---|---|
| 2004/0016991 | A1 | 1/2004 | Johnson et al. |
| 2004/0202041 | A1 | 10/2004 | Hidenori |
| 2005/0052915 | A1 | 3/2005 | Herner et al. |
| 2005/0087817 | A1* | 4/2005 | Zhang ........................ 257/390 |
| 2005/0194994 | A1* | 9/2005 | Dubey ......................... 326/88 |
| 2005/0226067 | A1* | 10/2005 | Herner et al. ............... 365/201 |
| 2005/0242386 | A1 | 11/2005 | Ang |
| 2005/0269628 | A1 | 12/2005 | King |
| 2006/0067127 | A1 | 3/2006 | Fasoli et al. |
| 2006/0086973 | A1* | 4/2006 | Hitani et al. ................ 257/335 |
| 2006/0125039 | A1* | 6/2006 | Levin et al. ................ 257/471 |
| 2006/0166473 | A1* | 7/2006 | Kocon ........................ 438/570 |
| 2006/0183283 | A1 | 8/2006 | Mitros et al. |
| 2006/0244099 | A1 | 11/2006 | Kurjanowicz |
| 2007/0007577 | A1 | 1/2007 | Bandyopadhyay et al. |
| 2007/0064484 | A1* | 3/2007 | McCollum et al. ..... 365/185.08 |
| 2007/0072360 | A1 | 3/2007 | Kumar et al. |
| 2007/0178683 | A1 | 8/2007 | Ramin et al. |
| 2008/0048188 | A1* | 2/2008 | Pei ............................. 257/66 |
| 2008/0182367 | A1 | 7/2008 | Petti |

OTHER PUBLICATIONS

Herner et al., "Vertical p-i-n Polysilicon Diode With Antifuse for Stackable Field-Programmable ROM", May 2004, IEEE Electron Device Letters, vol. 25, No. 5, pp. 271-273.

Herner et al., "Polysilicon Memory Switching: Electrothermal-Induced Order", Sep. 2006, IEEE Transactions on Electron Devices, vol. 53, No. 9, pp. 2320-2327.

Office Action of U.S. Appl. No. 11/669,859 dated Feb. 19, 2009.

Final Office Action of U.S. Appl. No. 11/669,859 mailed Aug. 17, 2009.

May 19, 2009 Reply to Feb. 19, 2009 Non-Final OA of U.S. Appl. No. 11/669,859.

Nov. 17, 2009 Reply to Aug. 17, 2009 Final Office Action of related U.S. Appl. No. 11/669,859.

Office Action of related U.S. Appl. No. 11/669,859 mailed Dec. 15, 2009.

Apr. 12, 2010 Reply to Office Action of related U.S. Appl. No. 11/669,859 mailed Dec. 15, 2009.

Final Office Action of U.S. Appl. No. 11/669,859 mailed Jul. 22, 2010.

Aug. 12, 2010 Reply to Final Office Action of U.S. Appl. No. 11/669,859 mailed Jul. 22, 2010.

Notice of Allowance and Examiner-Initiated Interview Summary of Related U.S. Appl. No. 11/669,859 mailed Oct. 14, 2010.

* cited by examiner

EMBEDDED MEMORY IN A CMOS CIRCUIT AND METHODS OF FORMING THE SAME

FIELD OF THE INVENTION

The present invention relates generally to semiconductor memory devices, and more particularly to embedded memory in a complimentary metal oxide semiconductor (CMOS) circuit and methods of forming the same.

BACKGROUND OF THE INVENTION

Numerous applications exist for small amounts of embedded non-volatile memory. For example, application specific integrated circuits (ASICs) or similar circuits may require embedded non-volatile memory to store programming code, firmware settings, configuration data or the like.

While many options exist for non-volatile memories such as floating gate memory devices, diode-based memory devices, etc., a need remains for cost effective embedded memories that may be formed using and/or integrated with existing fabrication processes.

SUMMARY OF THE INVENTION

In a first aspect of the invention, a first memory circuit is provided that includes (1) a two-terminal memory element formed on a substrate; and (2) a CMOS transistor formed on the substrate and adapted to program the two-terminal memory element. The two-terminal memory element is formed between a gate layer and a first metal layer of the memory circuit.

In a second aspect of the invention, a second memory circuit is provided that includes (1) a two-terminal memory element formed on a substrate, the two-terminal memory element having a first electrode and a second electrode; and (2) a CMOS transistor formed on the substrate, adapted to program the two-terminal memory element, and having a gate electrode formed from a gate layer deposited on the substrate. The first electrode of the two-terminal memory element is formed from the gate layer used to form the gate electrode of the CMOS transistor.

In a third aspect of the invention, a third memory circuit is provided that includes (1) a plurality of two-terminal memory elements formed on a substrate, each two-terminal memory element having a first electrode and a second electrode; and (2) a CMOS transistor formed on the substrate and adapted to program the two-terminal memory elements. The CMOS transistor has (a) a gate electrode formed from a gate layer deposited on the substrate; (b) a drain region; and (c) a drain contact that extends from the drain region to a first metal layer of the memory circuit. The first electrode of each two-terminal memory element is formed from the gate layer used to form the gate electrode of the CMOS transistor and the second electrode of each two-terminal memory element is formed from the first metal layer of the memory circuit.

In a fourth aspect of the invention, a memory is provided that includes (1) a memory array including a plurality of sets of two-terminal memory elements formed on a substrate, each of the two-terminal memory elements having a first electrode and a second electrode; and (2) a plurality of CMOS inverter circuits formed on the substrate, each CMOS inverter circuit adapted to program a different set of the two-terminal memory elements. Each CMOS inverter circuit includes a CMOS transistor having (a) a gate electrode formed from a gate layer deposited on the substrate; (b) a drain region; and (c) a drain contact that extends from the drain region to a first metal layer of the memory array. The first electrode of each two-terminal memory element is formed from the gate layer used to form the gate electrode of each CMOS transistor and the second electrode of each two-terminal memory element is formed from the first metal layer of the memory array.

In a fifth aspect of the invention, a first method of forming a memory circuit is provided that includes (1) forming a two-terminal memory element on a substrate between a gate layer and a first metal layer of the memory circuit; and (2) forming a CMOS transistor on the substrate, the CMOS transistor for programming the two-terminal memory element.

In a sixth aspect of the invention, a second method of forming a memory circuit is provided that includes (1) forming a gate layer on a substrate; (2) forming a two-terminal memory element on the substrate, the two-terminal memory element having a first electrode formed from the gate layer; and (3) forming a CMOS transistor on the substrate for programming the two-terminal memory element, the CMOS transistor having a gate electrode formed from the gate layer deposited on the substrate.

In a seventh aspect of the invention, a third method of forming a memory circuit is provided that includes (1) forming a plurality of two-terminal memory elements on a substrate, each two-terminal memory element having a first electrode and a second electrode; and (2) forming a CMOS transistor on the substrate for programming the two-terminal memory elements. The CMOS transistor has (a) a gate electrode formed from a gate layer deposited on the substrate; (b) a drain region; and (c) a drain contact that extends from the drain region to a first metal layer of the memory circuit. The first electrode of each two-terminal memory element is formed from the gate layer used to form the gate electrode of the CMOS transistor and the second electrode of each two-terminal memory element is formed from the first metal layer of the memory circuit.

In an eighth aspect of the invention, a method of forming a memory element is provided that includes (1) forming an isolation region in a substrate; (2) forming a first conductor of a first conductivity type on the isolation region using a gate layer deposited on the substrate and employed as part of a gate electrode of a CMOS transistor formed on the substrate; (3) forming an interlayer dielectric layer over the substrate; (4) forming a via opening in the interlayer dielectric layer to expose the first conductor; (5) filling the via opening with polysilicon; (6) doping an upper portion of the polysilicon filled via opening so as to form a polysilicon region of a second conductivity type; and (7) forming a second conductor above the upper portion of the polysilicon filled via.

In a ninth aspect of the invention, a fourth method of forming a memory circuit is provided that includes (1) forming an isolation region in a substrate; (2) forming a plurality of first conductors of a first conductivity type on the isolation region using a gate layer deposited on the substrate and employed as part of a gate electrode of a CMOS transistor formed on the substrate; (3) forming an interlayer dielectric layer over the substrate; (4) forming a plurality of via openings in the interlayer dielectric layer to expose each first conductor; (5) filling the via openings with polysilicon; (6) doping an upper portion of the polysilicon filled via openings so as to form a polysilicon region of a second conductivity type in each polysilicon filled via; and (7) forming a second conductor that extends above each upper portion of the polysilicon filled vias. Numerous other aspects are provided.

Other features and aspects of the present invention will become more fully apparent from the following detailed description, the appended claims and the accompanying drawings.

DETAILED DESCRIPTION

In one or more embodiments of the invention, embedded non-volatile memory is formed as part of a CMOS fabrication process. For example, one or more layers of one time programmable (OTP) memory, re-writable memory, or the like may be formed on a substrate using primarily conventional CMOS processes (e.g., with few changes to existing process sequences). A cost effective solution for providing small amounts of embedded memory thereby is provided.

In some embodiments, embedded memory is formed from one or more two-terminal memory elements. An exemplary two-terminal memory element includes a diode-based memory element such as a vertical p-n, n-p, p-i-n and/or n-i-p junction diode formed with or without an antifuse layer. As will be described further below, such diode-based memory elements may be used in one-time programmable memory (e.g., when antifuse layers are present) or re-writable memory (e.g., when antifuse layers are not present).

The use of two-terminal memory devices allows for increased memory density and/or more efficient use of substrate real estate. For example, a compact memory array of two-terminal memory devices may be created, as may one or multiple layers of two-terminal memory devices.

In one particular embodiment, two-terminal memory elements are formed between a gate layer and a first metal layer of an integrated circuit. Such memory element placement is compact and easily achieved with little impact on the fabrication process used to form the integrated circuit (e.g., a CMOS process). These and other aspects of the inventions are described below with reference to FIGS. 1-10.

Exemplary Embedded Memory Array

Figure 1:
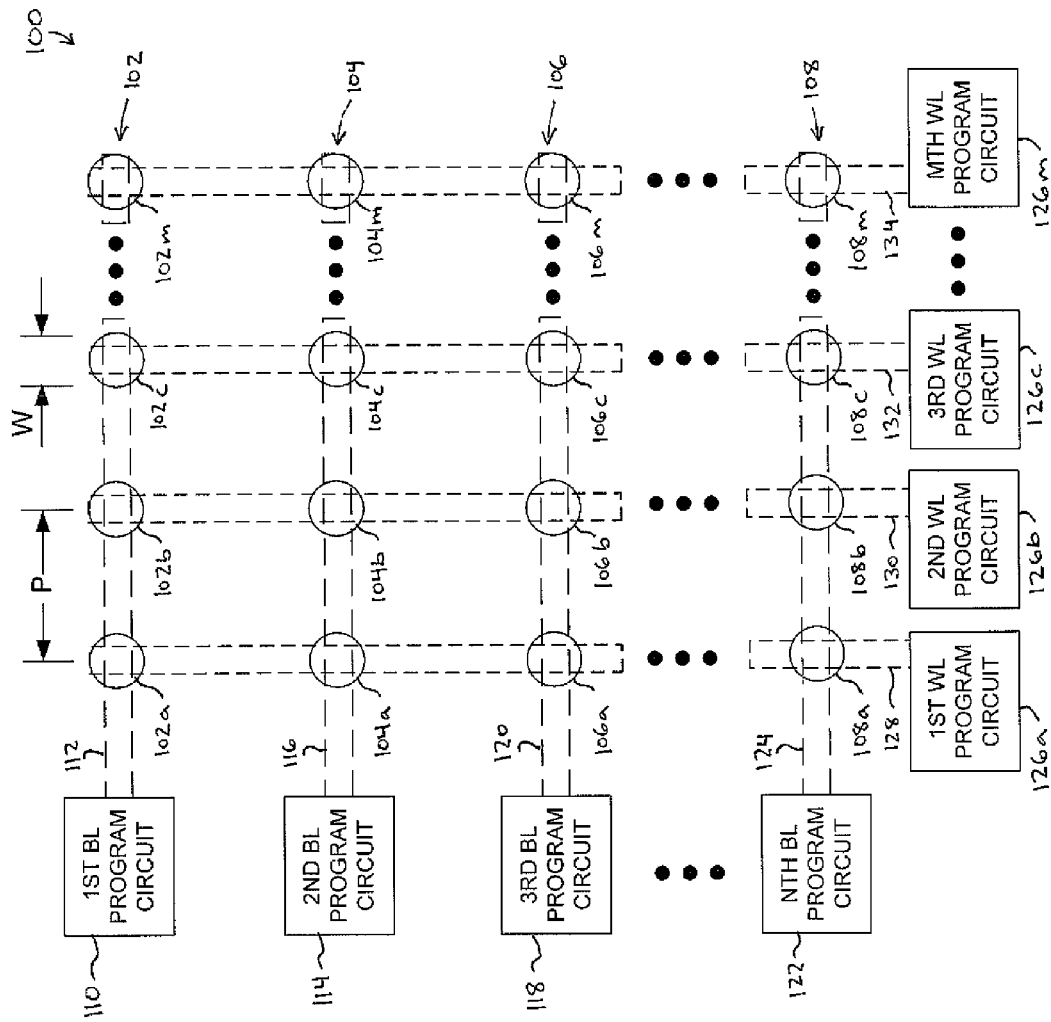
FIG. 1 is a schematic diagram of an exemplary embedded memory array provided in accordance with the present invention.

FIG. 1 is a schematic diagram of an exemplary embedded memory array 100 provided in accordance with the present invention. The memory array 100 may be embedded and/or otherwise associated with an integrated circuit (not separately shown) formed on a substrate (not shown) and used to provide a single layer of memory for use by the integrated circuit. Additional layers of memory may be provided (if desired).

With reference to FIG. 1, the memory array 100 includes a first memory element set 102 of memory elements 102a-m, a second memory element set 104 of memory elements 104a-m, a third memory element set 106 of memory elements 106a-m and an nth memory element set 108 of memory elements 108a-m. More or fewer memory element sets and/or memory elements per set may be used. Additionally, different memory element sets may use different numbers of memory elements.

In the embodiment of FIG. 1, memory elements 102a-m of the first memory element set 102 are coupled to a first bit line (BL) program circuit 110 by a first bit line 112. Likewise, memory elements 104a-m of the second memory element set 104 are coupled to a second BL program circuit 114 by a second bit line 116; memory elements 106a-m of the third memory element set 106 are coupled to a third BL program circuit 118 by a third bit line 120; and memory elements 108a-m of the nth memory element set 108 are coupled to an nth BL program circuit 122 by an nth bit line 124.

Further in the embodiment of FIG. 1, the first memory element 102a, 104a, 106a, 108a of each respective memory element set 102-108 is coupled to a first word line (WL) program circuit 126a via a first word line 128. Likewise, the second memory element 102b, 104b, 106b, 108b of each respective memory element set 102-108 is coupled to a second WL program circuit 126b via a second word line 130; the third memory element 102c, 104c, 106c, 108c of each respective memory element set 102-108 is coupled to a third WL program circuit 126c by a third word line 132; and the mth memory element 102m, 104m, 106m, 108m of each respective memory element set 102-108 is coupled to an mth WL program circuit 126m by an mth word line 134.

As will be described further below, each memory element 102a-m, 104a-m, 106a-m and 108a-m may be a two-terminal memory element. For example, each memory element may be a diode-based memory element such as a vertical p-n, n-p, p-i-n or n-i-p junction diode (with or without an antifuse layer) disposed between a respective bit line 112-124 and word line 128-134. Use of vertically-oriented, two-terminal memory elements consumes less substrate real estate than planar and/or three-terminal memory elements and increases memory density. While the memory elements of FIG. 1 appear cylindrical (circular from the top view of FIG. 1), it will be understood that other memory element shapes may be used (e.g., rectangular, triangular, etc.).

Bit line program circuits 110-122 may include any suitable circuitry for generating and/or supplying the voltages required to program each memory element 102a-m, 104a-m, 106a-m and 108a-m. In some embodiments, described below with reference to FIGS. 2A-10, bit line program circuits 110-122 may include one or more CMOS transistors (e.g., CMOS inverters) capable of generating voltages for programming the memory elements 102a-m, 104a-m, 106a-m and 108a-m.

Word line program circuits 126a-m may be any suitable circuitry for generating and/or supplying the voltages required to program each memory element 102a-m, 104a-m, 106a-m and 108a-m. In some embodiments, the word line program circuits 126a-m may be similar to the bit line program circuits 110-122. However, other word line program circuits may be used.

As shown in FIG. 1, the bit line program circuits 110-122 and/or word line program circuits 126a-m preferably are positioned adjacent to respective memory element 102a-m, 104a-m, 106a-m and 108a-m so as to increase device density and/or reduce substrate real estate consumption. In one or more embodiments, the bit line program circuits 110-122 and/or word line program circuits 126a-m are about 0.5 to 2 microns or less from their associated memory elements.

In operation, any memory element 102a-m, 104a-m, 106a-m, 108a-m may be programmed by application of appropriate voltages to the bit line, word line pair associated with the memory element. For example, to program memory element 102a, a high voltage (e.g., about 7.5-8 volts or any other suitable voltage) may be applied to first bit line 112 by first bit line program circuit 110 while first word line 128 is grounded (by first word line program circuit 126a). To prevent the programming of other memory elements, bit lines 116, 120 and 124 may be grounded (by bit line program circuits 114, 118, 122, respectively) and/or word lines 130, 132, and 134 may be held high by word line program circuits 126b-m, respectively (e.g., near or at about the same voltage applied to the first bit line 112). The other memory elements of the memory array 100 may be similarly programmed.

In at least one embodiment of the invention, the center-to-center distance or pitch "P" (FIG. 1) between memory elements in the same memory element set may be less than about 1.75 microns. The pitch between memory elements in adjacent memory element sets may be similar. Further, in some embodiments, the width "W" (FIG. 1) of each memory element may be less than about 800 nanometers. Other memory element pitch and/or width values may be used.

Exemplary Memory Circuit Formation

FIGS. 2A-9 are cross sectional views of a portion of a substrate 200 during formation of a memory element set, such as one of the memory element sets 102, 104, 106 or 108 of FIG. 1, in accordance with an exemplary embodiment of the invention.

Figure 2A:
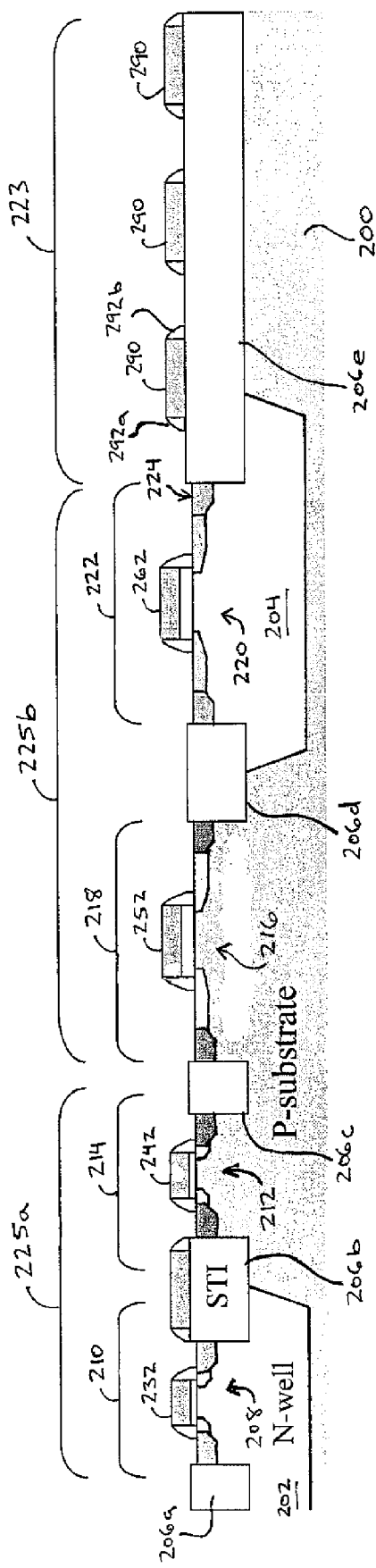
FIGS. 2A-9 are cross sectional views of a substrate during processing to form embedded memory elements on the substrate in accordance with the present invention.

With reference to FIG. 2A, the substrate 200 is shown as having already undergone several processing steps. The substrate 200 is a p-type substrate that includes a first n-well region 202 and a second n-well region 204 formed therein. Alternatively, the substrate 200 may be an n-type substrate having p-wells formed therein. In yet another embodiment, the substrate 200 may be undoped, a silicon-on-insulator (SOI) substrate, or the like and include both n-well and p-well regions.

The first and second n-well regions 202, 204 may be formed by doping the substrate 200 with an n-type dopant such as phosphorous, arsenic, etc. For example, phosphorous may be ion implanted into the substrate 200 using an implant dose of about $4-8\times10^{12}$ ions/cm$^2$, although other doses may be used.

As shown in FIG. 2A, the substrate 200 includes isolation regions 206a-e. First and second isolation regions 206a-b define a first active region 208 of the substrate 200 for a first p-channel metal oxide semiconductor (PMOS) transistor 210. Second and third isolations regions 206b-c define a second active region 212 of the substrate 200 for a first n-channel metal oxide semiconductor (NMOS) transistor 214. Third and fourth isolation regions 206c-d define a third active region 216 of the substrate 200 for a first high voltage (HV) NMOS transistor 218. Fourth and fifth isolation regions 206d-e define a fourth active region 220 of the substrate 200 for a first high voltage (HV) PMOS transistor 222. The fifth isolation region 206e also defines a location 223 for the two-terminal memory elements of the present invention to be formed on the substrate 200, and insulates the two terminal-memory elements from the other active devices on the substrate 200 (as described further below).

In some embodiments, the isolation regions 206a-e may be shallow trench isolation (STI) regions formed by etching trenches in the substrate 200, depositing a dielectric such as silicon dioxide, silicon nitride or another dielectric over the substrate 200 to fill the trenches and planarizing the substrate 200 to re-expose a top surface 224 of the substrate 200 (as shown in FIG. 2A). Note that in one or more embodiments, a silicon nitride or similar protective layer (not shown) may be formed over the active regions of the substrate 200 prior to isolation region formation (e.g., to protect the active regions). The protective layer may be removed following planarization, such that the isolation regions 206a-e extend above the top surface 224 of the substrate 200 as shown in FIG. 2A.

In one exemplary embodiment, the trenches may have a depth of about 0.25-0.5 microns. Silicon dioxide or nitride then may be blanket deposited over the substrate 200 using chemical vapor deposition (CVD) or a similar process. Chemical mechanical polishing (CMP) then may be employed to planarize the substrate 200. As an alternative, a localized oxidation of silicon (LOCOS) process or any other suitable process may be employed to define the isolation regions 206a-e.

The first PMOS transistor 210 and the first NMOS transistor 214 may be CMOS transistors (and/or represent any CMOS logic or circuit 225a) formed by conventional CMOS processes and are shown merely to illustrate that the two-terminal memory elements of the present invention may be easily embedded in a CMOS circuit without significantly varying the underlying CMOS processes used to form the CMOS circuit. In some embodiments, the CMOS transistors 210, 214 need not be located adjacent to the high voltage transistors 218, 222 (as shown) and/or the location 223 for the two-terminal memory elements (described below).

The high voltage CMOS transistors 218, 222 may be employed to program two-terminal memory elements as described further below. The high voltage CMOS transistors 218, 222 are referred to collectively as high voltage logic or program circuit 225b, and also may be formed using conventional CMOS processes.

Exemplary CMOS Transistors

Figure 2B:
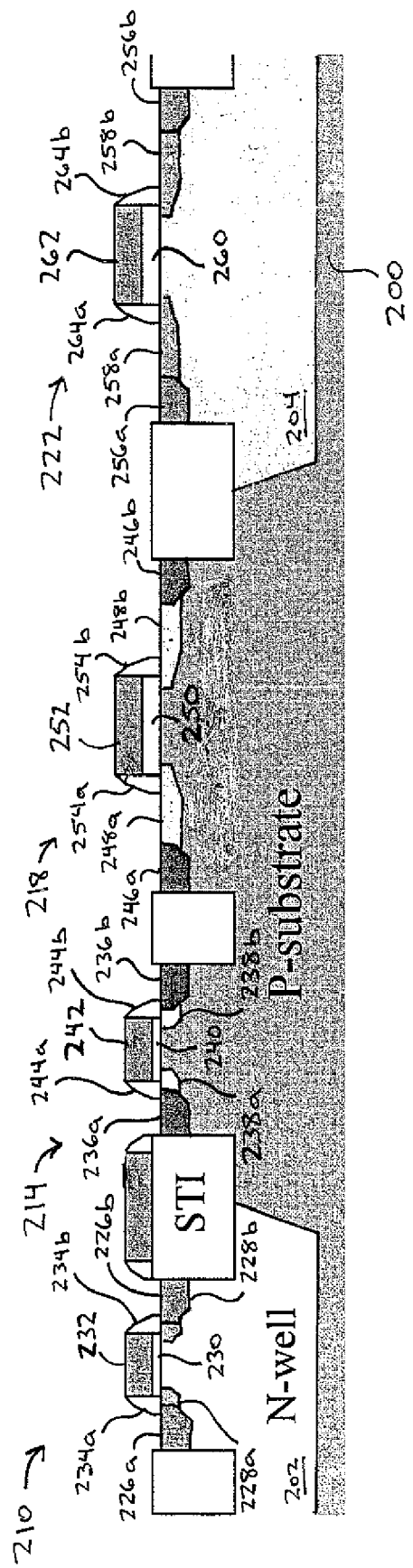

The first PMOS transistor 210 includes p-type diffusion regions 226a, 226b formed in the n well 202 (as shown in FIG. 2B, which is an enlarged view of the CMOS transistors 210, 214 and the high voltage transistors 218, 222). Further, p-type lightly doped drain (LDD) regions 228a, 228b are also provided (e.g., to reduce hot electron affects in the MOS transistors). A gate dielectric 230 and gate electrode 232 are formed over a channel region of the first PMOS transistor 210. The gate dielectric 230 may include silicon dioxide, silicon nitride, oxynitride or any other suitable gate dielectric. The gate electrode 232 may include any suitable gate conductor material, and in some embodiments, may include p+ polysilicon. Sidewall spacers 234a, 234b are formed adjacent to the gate electrode 232 and extend over the LDD regions 228a, 228b (as shown). The spacers 234a, 234b may include, for example, silicon dioxide, silicon nitride, a combination of the same such as a silicon nitride layer overlying a silicon dioxide layer, etc. The first NMOS transistor 214 similarly includes n-type diffusion regions 236a, 236b, n-type LDD regions 238a, 238b, a gate dielectric 240, a gate electrode 242 (e.g., n+ polysilicon) and spacers 244a, 244b.

Conventional diffusion processes (e.g., ion implantation, thermal diffusion, etc.) may be used to form the n, p and LDD regions of each transistor 210, 214. Similarly conventional gate dielectric formation processes may be used to form the gate dielectrics 230, 240 of transistors 210, 214 such as rapid thermal oxidation, chemical vapor deposition, etc.; and conventional gate electrode processes may be used to form the gate electrodes 232, 242 of transistors 210, 214 such as chemical vapor deposition of polysilicon followed by ion implantation to create the p+ or n+ doping. The spacers 234a 234b, 244a, 244b may be formed, for example, using chemical vapor deposition of silicon dioxide, silicon nitride, etc. CMOS processes that may be used to form the CMOS transistors 210, 214 are well known and are not described further herein.

Exemplary High Voltage CMOS Transistors

The first high voltage NMOS transistor 218 includes n-type diffusion regions 246a, 246b formed in the p substrate 200. Further, n-type "extended" lightly doped drain (LDD)

regions 248a, 248b are also provided. A gate dielectric 250 and gate electrode 252 are formed over a channel region of the first NMOS transistor 210. The gate dielectric 250 may include silicon dioxide, silicon nitride, oxynitride or any other suitable gate dielectric. The gate electrode 252 may include any suitable gate conductor material, and in some embodiments, may include n+ polysilicon. Sidewall spacers 254a, 254b are formed adjacent to the gate electrode 252, but unlike the first NMOS transistor 214, extend over only a portion of the LDD regions 248a, 248b (as shown). The spacers 254a, 254b may include, for example, silicon dioxide, silicon nitride, a combination of the same such as a silicon nitride layer overlying a silicon dioxide layer, etc. The first high voltage PMOS transistor 222 similarly includes p-type diffusion regions 256a, 256b, p-type extended LDD regions 258a, 258b, a gate dielectric 260, a gate electrode 262 (e.g., p+ polysilicon) and spacers 264a, 264b.

As can be seen in FIG. 2B, the high voltage transistors 218, 222 have longer channel regions and longer LDD regions than the CMOS transistors 210, 214, allowing the high voltage transistors 218, 222 to tolerate higher operating currents and voltages. Additionally, the gate dielectric thickness of the high voltage transistors 218, 222 is preferably thicker than the gate dielectric thickness of the CMOS transistors 210, 214 (e.g., to allow for higher operating voltages on the gates 252, 262 of the high voltage transistors 218, 222). In at least one embodiment, the gate dielectrics 250, 260 of the high voltage CMOS transistors 218, 222 have about two to three times the thickness of the gate dielectrics 230, 240 of the CMOS transistors 210, 214. Other dielectric thickness values may be used. CMOS processes that may be used to form the high voltage transistors 218, 222 are well known and are not described further herein.

Figure 2C:
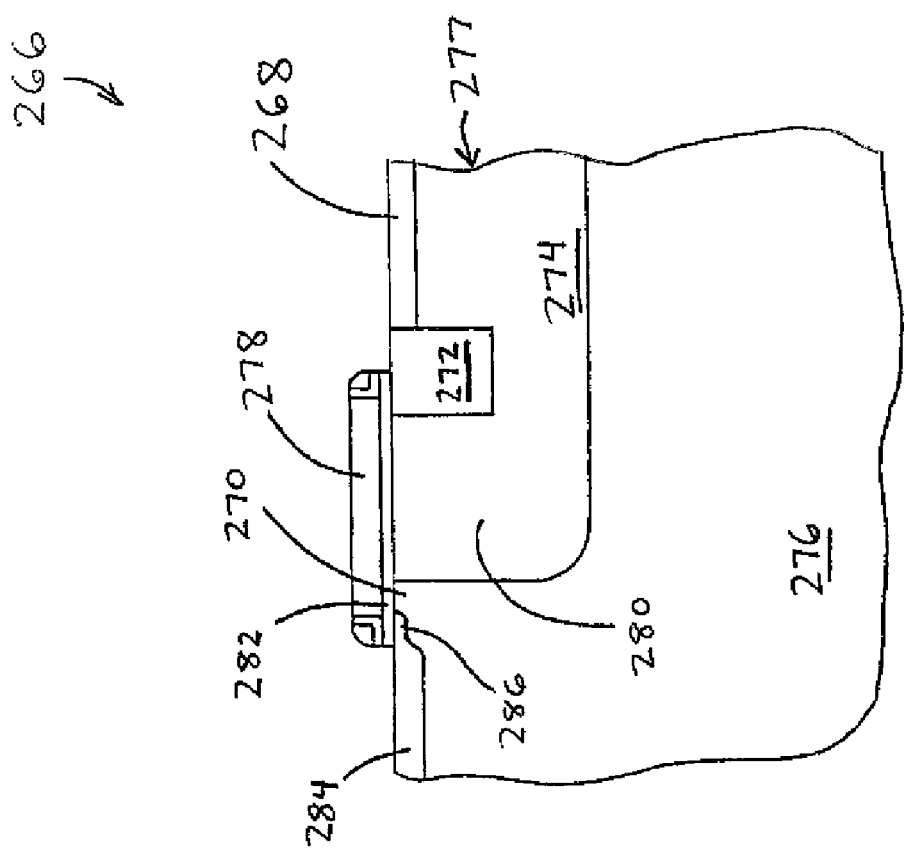

Other high voltage CMOS transistors may be employed in place of, or in addition to, the high voltage transistors 218, 222 described above. For example, U.S. Pat. No. 6,501,139, which is hereby incorporated by reference herein in its entirety, describes methods of forming high voltage CMOS transistors. An exemplary embodiment of such a transistor is shown in FIG. 2C. Specifically, FIG. 2C is a cross-sectional view of a portion of a high voltage transistor 266 in which a drain contact region 268 of the transistor is separated from a channel region 270 of the transistor by a shallow trench or similar isolation region 272. The isolation region 272 is formed in an n- or p-well 274 (of a substrate 276) that defines drain region 277. Separating the drain contact region 268 from the channel region 270 of the transistor 266 (and a portion 280 of the drain region 277) reduces the magnitude of the electric field between a gate electrode 278 and the drain contact region 268 of the transistor 266. Higher voltage and/or current operation of the transistor 266 thereby is allowed. Note that FIG. 2C also illustrates an exemplary gate dielectric 282, source region 284 and LDD region 286.

Exemplary Two-Terminal Memory Elements

As stated, the fifth isolation region 206e (FIG. 2A) defines the location 223 for the two-terminal memory elements of the present invention to be formed on the substrate 200. Formation of the two-terminal memory elements begins with formation of the lower electrode of each two-terminal memory element. As shown in FIG. 2A, in at least one embodiment, the gate layer used to form the gate electrodes 232, 242, 252, 262 of the transistors 210, 214, 218, 222 is also patterned to form a first conductor 290 for each memory element in the memory element set (to be formed). While three first conductors 290 are shown in FIG. 2A, it will be understood that fewer or more first conductors and/or memory elements may be provided.

In some embodiments, the same mask and/or etch processes used to pattern the gate electrodes 232, 242, 252, 262 of the transistors 210, 214, 218, 222 may be used to pattern the first conductor 290 of each memory element. In other embodiments, different masks and/or etch processes may be used to pattern the gate electrodes of the transistors 210, 214, 218, 222 and the first conductor 290 of each memory element. In either case, a hard mask (e.g., silicon nitride) or soft mask (e.g., photoresist) may be used to pattern the gate electrodes of the transistors 210, 214, 218, 222 and/or the first conductor 290 of each memory element. Likewise, any suitable etch process may be used to etch the gate electrodes of the transistors 210, 214, 218, 222 and/or the first conductor 290 of each memory element (e.g., wet, dry, anisotropic, isotropic, etc.).

In some embodiments, the first conductor 290 of each memory element is formed from n+ polysilicon and serves as both the lower conductor for the memory element and an n+ region of a p-i-n diode of the memory element (described below). In other embodiments, a separate conductor, such as tungsten with a titanium nitride adhesion layer or another suitable conductor, may be used for the first conductor 290. Other exemplary conductors include aluminum, copper, etc., and other exemplary adhesion layers include tantalum nitride, tungsten nitride, combinations of one or more adhesion layers, or the like.

In the embodiment of FIG. 2A, the first conductor 290 of each memory element may be formed, for example, from about 1500-2000 angstroms of phosphorus or arsenic doped polysilicon having a doping concentration of about $10^{21}$ cm$^{-3}$. Other layer thicknesses, doping types and/or doping concentrations may be used. In some embodiments, doping of the first conductor 290 of each memory element may be performed at the same time and using the same doping process used to dope the gate electrodes 242, 252 and/or the source and drain of the NMOS transistors 214, 218 (e.g., by using ion implantation of phosphorous, arsenic or another suitable n-type dopant). In other embodiments, a separate doping step may be used for the first conductor 290 of each memory element.

In an alternative embodiment of the invention, the lower conductor 290 may be formed from p+ polysilicon. In such an embodiment, each memory element will be formed from a vertical, n-i-p or n-p diode, rather than a vertical, p-i-n or p-n diode. For example, doping of the p+ first conductor 290 of each memory element may be performed at the same time and using the same doping process used to dope the gate electrodes 232, 262 and/or the source and drain of the PMOS transistors 210, 222 (e.g., by using ion implantation of boron or another suitable p-type dopant). In other embodiments, a separate doping step may be used for the p+ first conductor 290 of each memory element. Further, an n-i-p or n-p diode structure may be used for each memory element with a lower conductor that is separate from the p+ polysilicon region (e.g., such as a conductor with an adhesion layer).

As shown in FIG. 2A, in some embodiments, side wall spacers 292a, 292b may be formed on the sidewalls of the first conductor 290 of each memory element (to be formed). The sidewalls spacers 292a, 292b may include SiO$_2$, Si$_3$N$_4$, a combination of the same or any other suitable spacer material. For example, the spacers 292a, 292b may be formed from approximately 600-1200 angstroms of silicon dioxide and/or silicon nitride. In one particular embodiment, the spacers 292a, 292b are formed by depositing a layer of silicon dioxide over the first conductor 290 of each memory element to be formed, and then by forming a silicon nitride layer over the silicon dioxide layer. The silicon nitride layer is then anisotropically etched to form the spacers 292a, 292b using the silicon dioxide layer as an etch stop layer.

Figure 3:
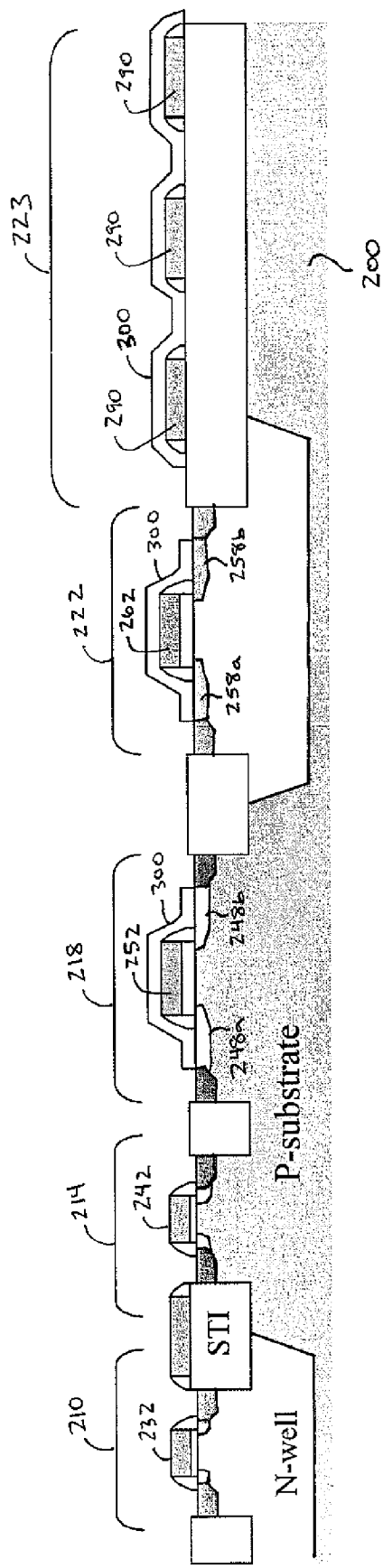

Following formation of the transistors 210, 214, 218 and/or 222 and the first conductor 290 for each memory element, a salicidation process may be performed on the substrate 200 to make low resistance contact regions for the transistors 210, 214, 218, 222. For example, a salicide protection layer 300 may be deposited over the substrate 200 and patterned as shown in FIG. 3 to cover the extended LDD regions 248a, 248b and gate electrode 252 of the high voltage NMOS transistor 218, the extended LDD regions 258a, 258b and gate electrode 262 of the high voltage PMOS transistor 222 and the first conductor 290 of each memory element to be formed.

As an example, the salicide protection layer 300 may be formed by depositing approximately 200-300 angstroms of silicon dioxide over the substrate 200 and then patterning the salicide protection layer 300 so that only the above noted areas of the high voltage transistors 218, 222 and the first conductor 290 of each memory element to be formed are covered by the salicide protection layer 300. Low pressure or plasma enhanced CVD, for example, may be used to deposit the silicon dioxide layer. The salicide protection layer 300 may be patterned using conventional lithography techniques, with a soft or hard mask, and wet or dry etch processing. Other salicide protection layer materials, thicknesses and processes may be employed.

Following formation and patterning of the salicide protection layer 300, the substrate 200 may be exposed to a salicidation process. For example, cobalt or another suitable material may be blanket deposited over the substrate 200 and reacted with any exposed silicon surfaces using a suitable annealing process. In some embodiments, about 50 angstroms of cobalt may be deposited over the substrate 200 (e.g., using physical vapor deposition or another suitable process) and rapid thermal annealed to create $CoSi_2$ at the silicon/cobalt interface(s). An exemplary rapid thermal anneal process may be performed at about 400-700° C. in an inert gas such as nitrogen or argon for about 20 to 100 seconds. Other anneal times, temperatures and/or environments may be used. Note that $CoSi_2$ only forms on the exposed single crystalline and polysilicon surfaces, and not on the salicide protection layer 300.

Figure 4:
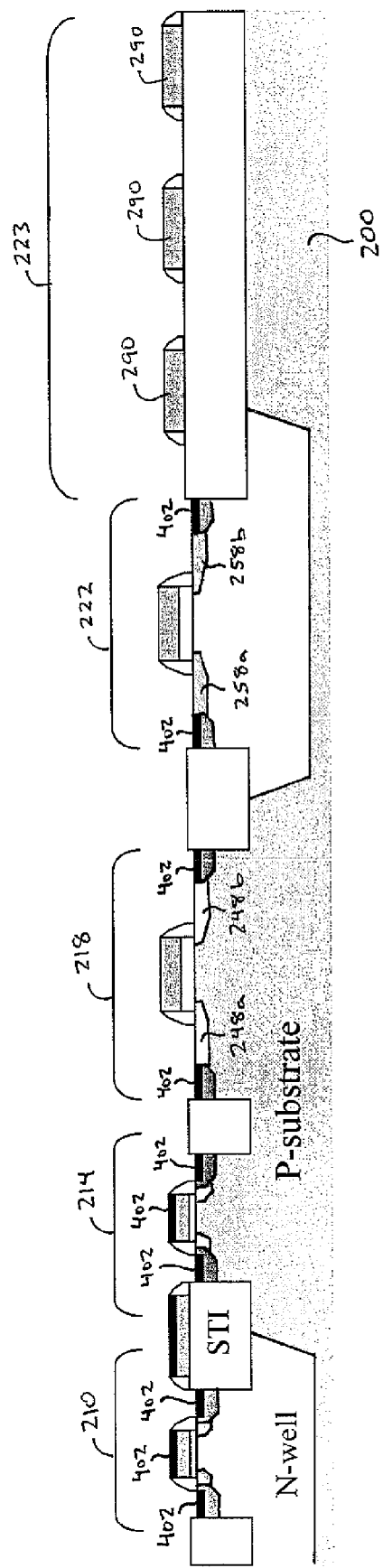

After the anneal step, the unreacted cobalt may be removed from the substrate 200 as shown in FIG. 4, which illustrates the substrate 200 following removal of unreacted cobalt. As shown in FIG. 4, $CoSi_2$ regions 402 are formed on the source, drain and gate of the transistors 210 and 214, and on the source and drain of the high voltage transistors 218 and 222. Because of the sidewall spacers 234a, 234b (FIG. 2B) and 244a, 244b, the LDD regions 228a, 228b and 238a, 238b of the transistors 210, 214 are not salicided. Further, because of the salicide protection layer 300, the extended LDD regions 248a, 248b and 258a, 258b of the high voltage transistors 218, 222 are not salicided.

Any suitable selective etch process may be used to remove the unreacted cobalt from the substrate 200 while leaving the cobalt salicide. For example, a selective wet etch process may be employed to remove the unreacted cobalt from the substrate 200. Similarly, and as shown in FIG. 4, in some embodiments, the salicide protection layer 300 may be removed following unreacted cobalt removal. Any suitable etching process may be employed to remove the salicide protection layer 300 (e.g., wet, dry, selective, etc.).

Figure 5:
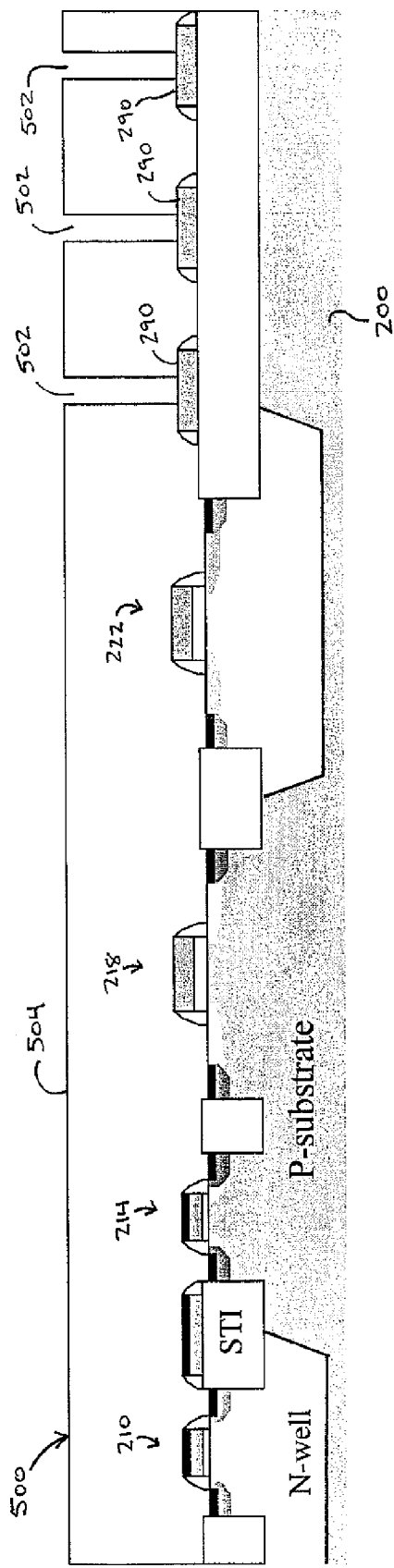

As shown in FIG. 5, following salicidation of transistors 218, 214, 218 and 222, an interlayer dielectric layer 500 (or poly-metal dielectric (PMD) layer) is formed over the substrate 200. For example, approximately 3000-7000 angstroms of silicon dioxide may be deposited on the substrate 200 and planarized using chemical mechanical polishing to form the planar dielectric layer 500. Other interlayer dielectric materials such as low K dielectrics and/or other dielectric layer thicknesses may be used. Exemplary low K dielectrics include carbon doped oxides, silicon carbon layers, or the like.

After the substrate 200 has been planarized, first via openings 502 are formed in the interlayer dielectric 500 for each memory element to be formed. The first via openings 502 define openings for the junction diodes (described below) used in the memory elements and are referred to herein as "diode via openings".

Each diode via opening 502 extends from an upper surface 504 of the interlayer dielectric layer 500 to an upper surface of a respective first conductor 290. For example, a silicon nitride or other suitable hard mask layer (not shown) may be deposited on the substrate 200, and lithographically patterned to expose the interlayer dielectric layer 500 over the first conductor 290 of each memory element to be formed. The silicon nitride layer then may be used as an etch stop layer during etching of the interlayer dielectric layer 500 to form each diode via opening 502. Any suitable etching process may be used (e.g., wet, dry, anisotropic, isotropic, etc.). Similarly, in some embodiments, a soft mask may be used to pattern the interlayer dielectric layer 500.

As will be described further below, the width of each diode via opening 502 defines the width of the vertical junction diode of each memory element. In some embodiments, a diode via opening width of about 100 nanometers may be used. Other diode via opening widths may employed.

Figure 6:
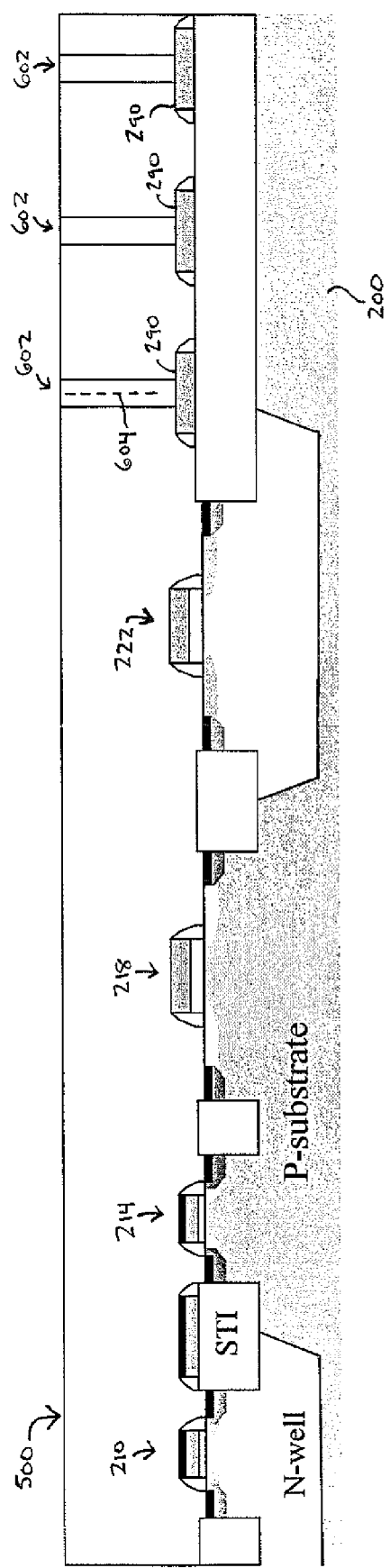

With reference to FIG. 6, following formation of the diode via openings 502 in the interlayer dielectric layer 500, each diode via openings 502 is filled with undoped (or unintentionally doped) polysilicon (creating polysilicon filled vias 602 in FIG. 6). For example, amorphous undoped polysilicon may be deposited over the substrate 200 and planarized (e.g., using CMP or a selective etch (back) process). In some embodiments, a seam or grain boundary may form in a central region of the polysilicon filled vias as represented by dotted line 604 in FIG. 6. Such a seam or grain boundary may getter defects in the polysilicon and improve device performance.

Figure 7:
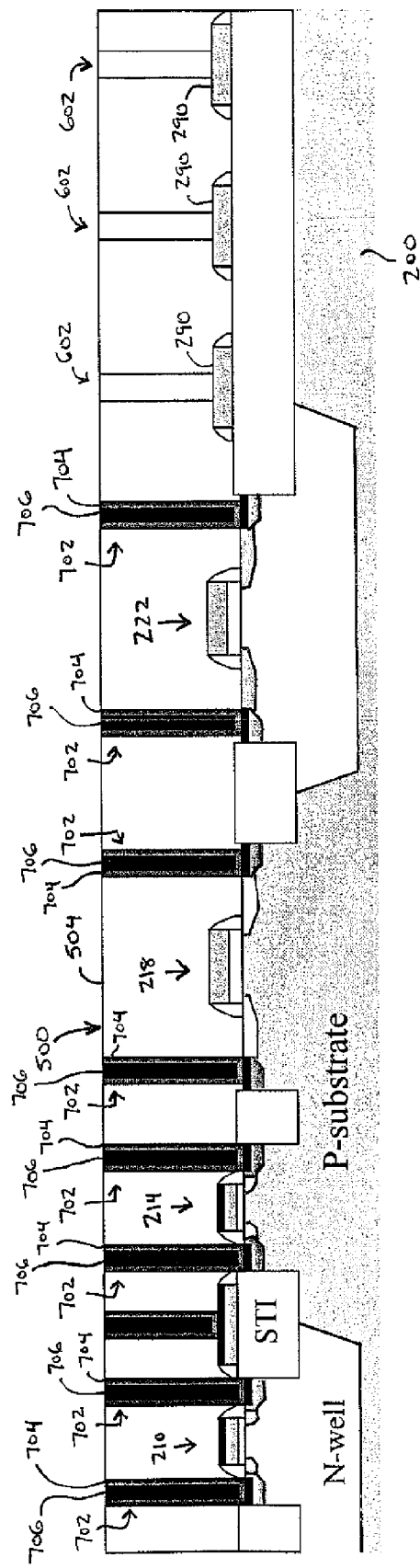

After the diode via openings 502 have been filled and the substrate 200 has been planarized (FIG. 6), second via openings 702 (FIG. 7, shown filled) are formed in the interlayer dielectric layer 500 for making contact to the drain and source of the NFET and the PFET transistors 210, 214, 218, 222 (hereinafter "contact" via openings). Each contact via opening 702 extends from the upper surface 504 of the interlayer dielectric layer 500 to an upper surface of a respective drain or source. For example, a silicon nitride or other suitable layer (not shown) may be deposited on the substrate 200, and lithographically patterned to expose the interlayer dielectric layer 500 over each drain and source region. The silicon nitride layer then may be used as an etch stop layer during etching of the interlayer dielectric layer 500 to form each contact via opening 702. Any suitable etching process may be used (e.g., wet, dry, anisotropic, isotropic, etc.). In some embodiments, a contact via opening width of about 100 nanometers may be used to define the width of each contact. Other contact via opening widths may be employed.

Following formation of the contact vias openings 702 in the interlayer dielectric layer 500, a barrier/liner layer is deposited on the substrate 200 so as to form a barrier/liner coating 704 on at least the sidewalls of the contact via openings 702. The barrier/liner layer may include any suitable barrier/liner material. In one exemplary embodiment, the barrier/liner layer may comprise approximately 100-200 angstroms of titanium nitride (e.g., deposited using a chemical vapor deposition (CVD) process such as metal-organic CVD (MOCVD), a physical vapor deposition process such as sputter deposition, etc.). Other barrier/liner materials and/or thicknesses may be used.

Following barrier/liner layer formation, the contact via openings 702 are filled with a conductive material 706. For example, tungsten, aluminum, copper or another suitable conductive material may be deposited over the substrate to fill the via openings 702 (e.g., using a CVD process such as MOCVD). In some embodiments, a seed layer such as a copper layer may be deposited over the barrier/liner layer (e.g., using PVD) and then electroplating may be used to fill the contact via openings 702.

After the contact via openings 702 have been filled, the substrate 200 is planarized (as shown in FIG. 7). For instance, CMP or another technique may be used to planarized the substrate 200.

Figure 8:
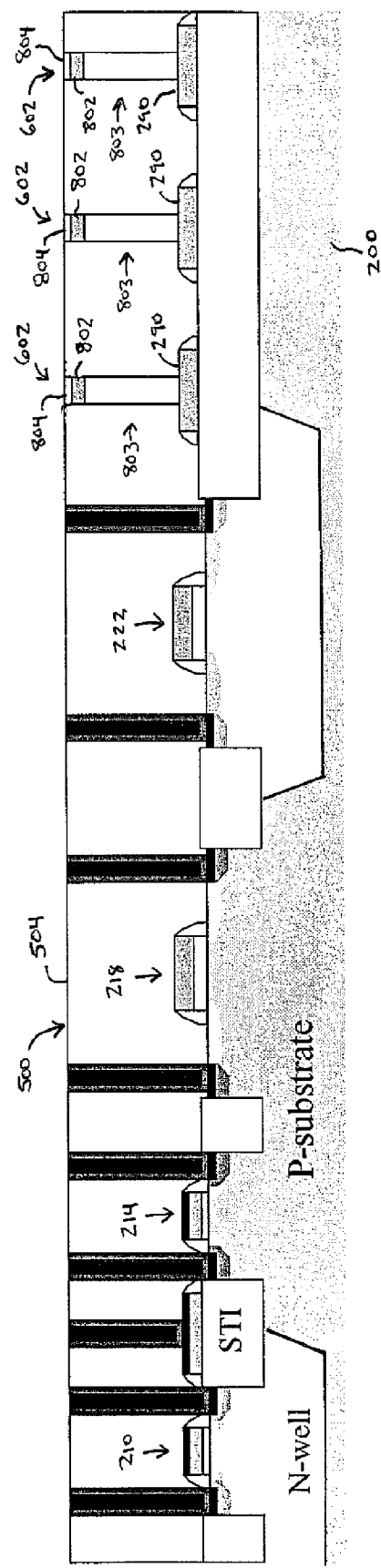

With reference to FIG. 8, Formation of the memory element set continues by defining a p+ region 802 within the polysilicon filled vias 602, near the upper surface 504 of the interlayer dielectric layer 500. For example, a blanket p+ implant may be employed to implant boron a predetermined depth within the polysilicon filled vias 602. Exemplary molecular ions include $BF_2$, $BF_3$, $B_2$ and the like. In some embodiments, an implant dose of about $1\text{-}5\times10^{15}$ ions/cm² may be employed. Other implant species and/or doses may be used. Further, in some embodiments, a diffusion process may be employed to dope the upper portion of the polysilicon filled vias 602. In at least one embodiment, the p+ regions 802 have a depth of about 300-700 angstroms, although other p+ region sizes may be used. (Note that if the diodes to be formed are n-p or n-i-p diodes, rather than p-n or p-i-n diodes, the upper portion of the polysilicon filled vias 602 will be doped n-type).

Following implant, a rapid thermal annealing process may be employed to recrystallize the implanted polysilicon vias 602. For example, the substrate 200 may be heated to a temperature of about 750° C. for about 30 seconds in an inert environment such as nitrogen, argon, etc. Other annealing times, temperatures and/or environments may be used.

Once the p+ region 802 has been defined within each polysilicon filled via 602, each polysilicon filled via 602 contains a vertically oriented, p-i-n junction diode 803 formed by p+ region 802, first conductor 290 (e.g., n+ polysilicon) and the undoped polysilicon that lies therebetween. As stated, p-n, n-p or n-i-p diodes also may be used.

In some embodiments, each vertical memory element may be one time programmable (OTP). For example, each memory element may store data based on a "blown" or "unblown" state of an antifuse layer present in the memory element. In such memory elements, the antifuse layer may be located near a top or a bottom of the memory element (e.g., between a top conductor and the junction diode used to form the memory element or between a bottom conductor and the junction diode used to form the memory element). FIG. 8 illustrates an antifuse layer 804 formed above each junction diode 803 used to form each memory element (at a top of each polysilicon filled via 602). As stated, each antifuse layer 804 alternatively may be located below the first conductor 290.

Each antifuse layer 804 may be formed by oxidation of the top surface of the polysilicon filled vias 602. For example, rapid thermal oxidation may be employed for about 30-60 seconds in oxygen at a temperature of about 625-725° C. to form an antifuse layer 804 of about 14-16 angstroms at the top of each polysilicon filled via 602. Other times, temperatures and/or environments may be used (e.g., to form other antifuse layer thicknesses, other antifuse materials such as $Si_3N_4$, etc.). Note that in embodiments of the invention that employ an antifuse layer as part of a memory element, polysilicon recrystallization anneal (following formation of p+ regions 802) may be performed before or after antifuse layer formation.

In other embodiments, each vertical memory element may be re-writable. For example, each memory element may store data based on a "resistance" or "resistivity" state of the polysilicon used to form the memory element. U.S. patent application Ser. No. 11/496,986, filed Jul. 31, 2006, titled "Method for using a Memory Cell Comprising Switchable Semiconductor Memory Element with Trimmable Resistance", which is hereby incorporated by reference herein in its entirety, describes polysilicon junction diodes having a resistivity state that may be changed from a high resistivity to a low resistivity, and then returned to the high resistivity state (through application of the appropriate electrical pulses). In some embodiments, a data (resistivity) state of a polysilicon junction diode is set by applying an electrical pulse while the junction diode is forwarded biased; and the data (resistivity) state of the polysilicon junction diode is reset by applying an electrical pulse while the junction diode is reversed (or vice versa). The memory cell may be used as a one time programmable cell or as a re-writable cell having multiple data states. In addition to polysilicon, other polycrystalline or microcrystalline semiconductor materials may be employed for the junction diode (e.g., germanium, silicon-germanium, etc.).

As a further example, rather than employing an antifuse layer to create a one-time programmable memory element, a one-time programmable resistivity state memory element may be used. For example, U.S. patent application Ser. No. 10/955,549, filed Sep. 29, 2004, titled "Nonvolatile Memory Cell Without a Dielectric Antifuse Having High- and Low-Impedance States", which is hereby incorporated by reference herein in its entirety, describes a one time programmable memory cell having a data state that is stored in a resistivity state of a polysilicon junction diode. The polysilicon junction diode has a high resistivity state when unprogrammed and a low-resistivity state after application of a programming voltage to the polysilicon junction diode.

In at least one embodiment, a separate layer of polycrystalline, amorphous or microcrystalline semiconductor material may be provided in series with a junction diode in a memory element. In such an embodiment, the data state of the memory element may be stored in the resistivity state of the separate layer of semiconductor material rather than in the resistivity state of the junction diode (e.g., via application of the appropriate voltage(s) to the separate layer of semiconductor material). Such a memory element may be one time programmable or re-writable (e.g., and need not employ an antifuse layer). Further, "resistivity-based" memory elements also may be employed with an antifuse if desired.

Figure 9:
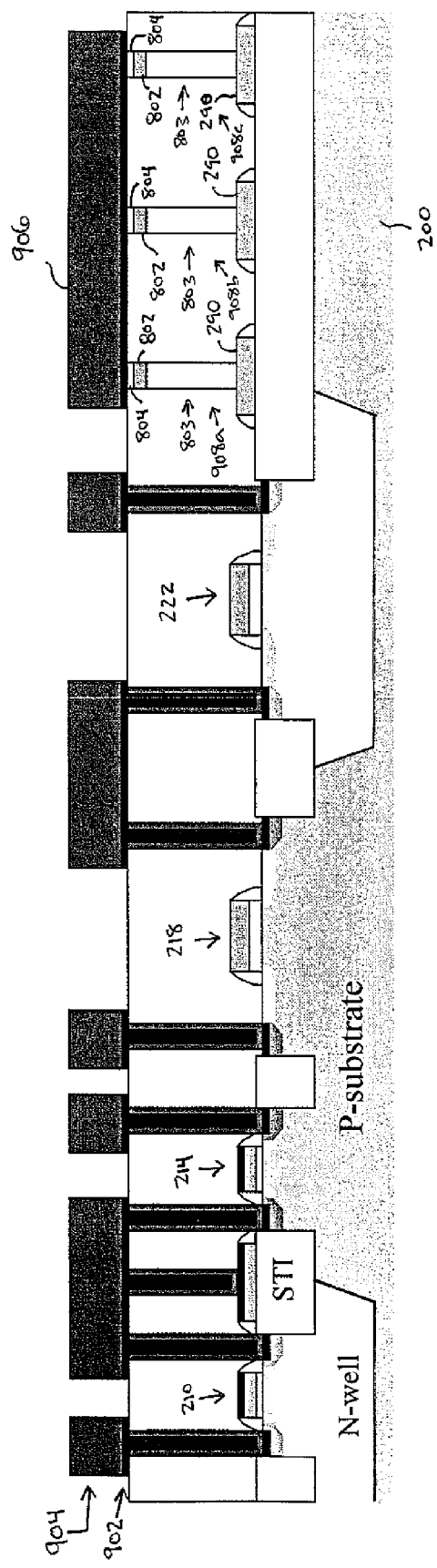

With reference to FIG. 9, following either p+ implant for resistivity-based memory elements or antifuse layer formation for antifuse-based memory elements, a first metal layer is formed over the substrate 200. For example, a barrier/liner layer 902 may be formed over the substrate 200, followed by a first metal layer 904 (both shown patterned in FIG. 9). In some embodiments, the barrier/liner layer 902 may include about 200 angstroms of titanium nitride and the first metal layer 904 may include about 3000-5000 angstroms of aluminum. Other barrier/liner and/or first metal layer materials (e.g., TaN, WN, TiW, W, Cu, etc.) and/or thicknesses may be used.

The first metal layer 904 (and barrier/liner layer 902) may be patterned as desired. For example, in one or more embodiments, the barrier/liner layer 902 and first metal layer 904 may be patterned into one or more bit lines (e.g., each bit line coupling a set of one or more memory elements to a program circuit as previously described with reference to FIG. 1). Any conventional lithography and etch techniques may be used to pattern the barrier/liner layer 902 and the first metal layer 904 (e.g., soft mask, hard mask, wet etch, dry etch, etc.).

With reference to FIG. 9, the barrier/liner layer 902 and the first metal layer 904 are patterned so as to form a top conductor 906 (e.g., a bit line) for each junction diode 803. A plurality of memory elements 908a-c thereby is formed between a gate layer (e.g., the gate layer used to form the gate electrodes 232, 242, 252, 262 of the transistors 210, 214, 218, 222) and a first metal layer (e.g., first metal layer 904). For example, each memory element 908a-c may include (1) a first, bottom conductor 290; (2) a p-i-n diode 803 formed in a polysilicon filled via 602 between the bottom n+ conductor 290 and a top p+ region 802; and (3) a top conductor (bit line) 906. In some embodiments, each memory element 908a-c may also include an antifuse layer 804.

As shown in FIG. 9, the barrier/liner layer 902 and first metal layer 904 are also patterned so that:

(1) drain regions of the CMOS transistors 210, 214 are coupled together (e.g., to form a CMOS inverter or other CMOS logic); and (2) drain regions of the high voltage CMOS transistors 218, 222 are coupled together (e.g., to form a CMOS inverter as described below).

Figure 10:
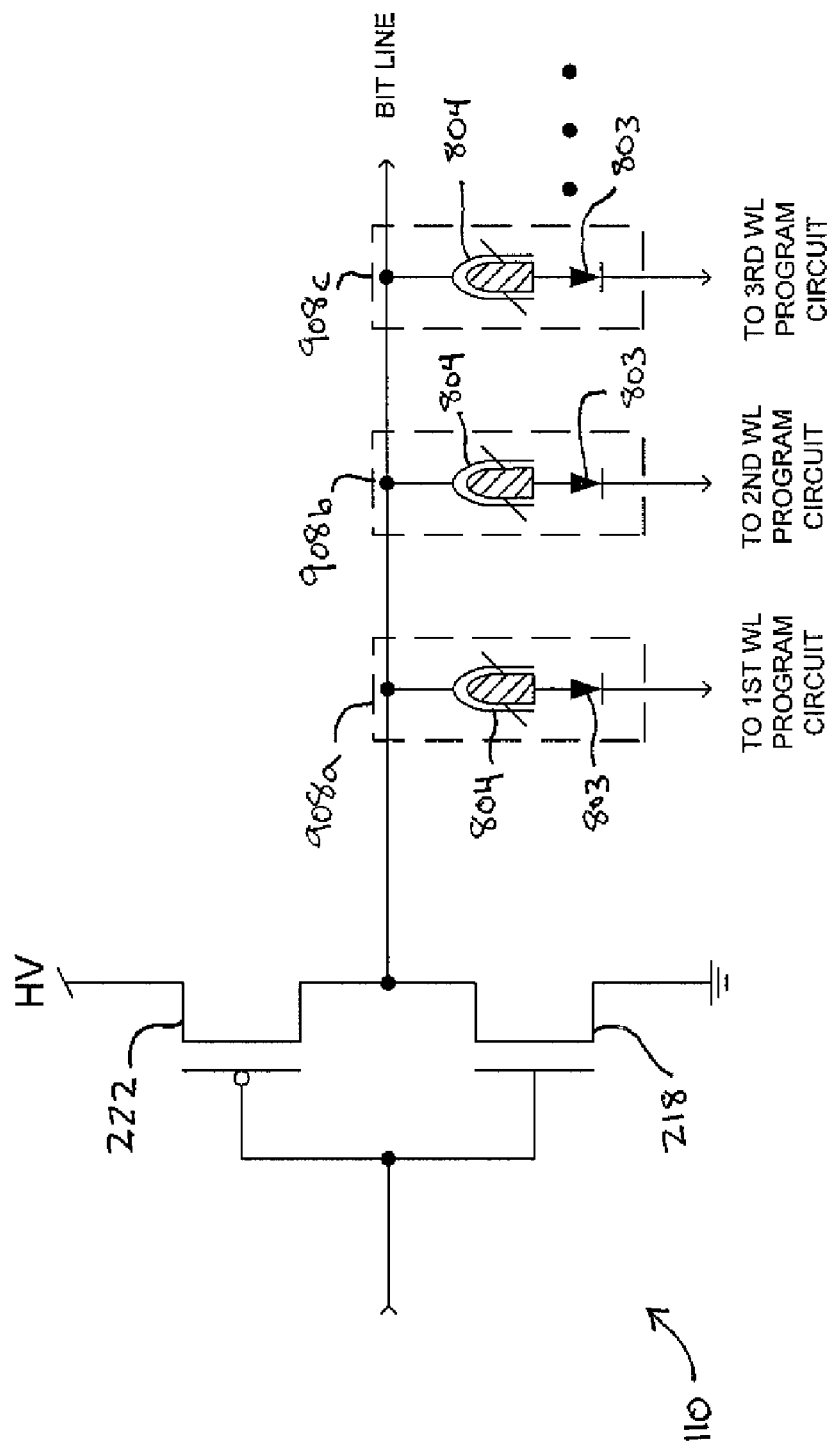
FIG. 10 is a schematic representation of an exemplary CMOS circuit with embedded memory elements provided in accordance with the present invention.

Although not shown in FIG. 9, the barrier/liner layer 902 and first metal layer 904 may also be patterned so that drain regions of the high voltage CMOS transistors 218 and 222 are coupled to the bit line 906. For example, the high voltage CMOS transistors 218, 222 may be coupled so as to form a CMOS inverter "program circuit" for programming the memory elements 908a-c, such as by coupling (a) the source of the high voltage NMOS transistor 218 to ground; (b) the source of the high voltage PMOS transistor 222 to a high voltage (e.g., 7-8 volts); (c) the drains of the high voltage CMOS transistors 218, 222 together and to the bit line 906; and (d) the gate electrodes 252, 262 of the high voltage CMOS transistors 218, 222 together (e.g., as an input). FIG. 10 is a schematic representation of such an exemplary CMOS circuit 1000. Additional processing may be employed to couple the first conductor 290 of each memory element 908a-c to appropriate program circuitry (e.g., via one or more word lines as described previously with reference to FIG. 1).

As described above, in one or more embodiments of the invention, embedded non-volatile memory is formed as part of a CMOS fabrication process. For example, one or more layers of one time programmable (OTP) memory, re-writable memory, or the like may be formed on a substrate using primarily conventional CMOS processes (e.g., with few changes to existing process sequences). In the embodiments described above, only six or seven additional process steps are employed for memory element formation:

(1) lithographic patterning of diode via openings (e.g., using a standard contact mask process);

(2) etching of diode via openings (e.g., using a standard contact etch process);

(3) polysilicon deposition to fill diode via openings (e.g., for memory element junction diodes, using a standard polysilicon deposition process);

(4) polysilicon planarization (e.g., using a standard polysilicon CMP process);

(5) p+ implant for top region of p-i-n junction diodes (e.g., using a standard implant process);

(6) antifuse formation, if applicable (e.g., using a standard rapid thermal oxidation process); and (7) polysilicon recrystallization of p+ implant (e.g., using a standard rapid thermal anneal process).

All of the above processes are typically available during CMOS fabrication.

The foregoing description discloses only exemplary embodiments of the invention. Modifications of the above disclosed apparatus and methods which fall within the scope of the invention will be readily apparent to those of ordinary skill in the art. For instance, in some embodiments, combinations of one time programmable and re-writable memory elements may be embedded in a CMOS circuit. Further, additional (vertical) layers of memory elements may be provided (e.g., between higher metal layers). While the present invention has been described primarily with reference to silicon, it will be understood that other material systems may be used such as germanium, a silicon-germanium alloy, etc.

In some embodiments, the first metal layer and/or bit line of a memory circuit may be implemented using a copper damascene process. For instance, the first metal layer 904 (FIG. 9) and/or the bit line 906 (FIG. 9) may be formed using copper and a suitable barrier/liner layer. In at least one embodiment, antifuse layer formation may be performed after copper damascene trench formation (e.g., for the first metal layer and/or bit line).

Accordingly, while the present invention has been disclosed in connection with exemplary embodiments thereof, it should be understood that other embodiments may fall within the spirit and scope of the invention, as defined by the following claims.

The invention claimed is:

1. A memory circuit comprising:
   a gate layer formed on a substrate;
   a dielectric layer formed over the gate layer;
   a first metal layer formed on an upper surface of the dielectric layer;
   a via opening extending from the upper surface of the dielectric layer to the gate layer; and
   a two-terminal memory element formed in the via opening and comprising a diode-based memory element; and
   a CMOS transistor formed on the substrate and adapted to program the two-terminal memory element;
   wherein the two-terminal memory element is formed between the gate layer and the first metal layer.

2. The memory circuit of claim 1 wherein the two-terminal memory element is positioned laterally adjacent to the CMOS transistor.

3. The memory circuit of claim 1 wherein the two-terminal memory element is formed on an isolation region of the substrate that isolates a first terminal of the memory element from the CMOS transistor.

4. The memory circuit of claim 1, wherein the diode-based memory element comprises:
   a first conductor;
   a second conductor formed above the first conductor; and
   a vertically oriented junction diode disposed between the first and second conductors.

5. The memory circuit of claim 4, wherein the vertically oriented junction diode is formed from polysilicon and includes a deposition induced central grain boundary that getters defects.

6. The memory circuit of claim 4 wherein the first conductor is at a level of a gate layer of the CMOS transistor.

7. The memory circuit of claim 6 wherein the first conductor is formed from the gate layer used to form the CMOS transistor.

8. The memory circuit of claim 4 wherein the first conductor comprises doped polysilicon.

9. The memory circuit of claim 8 wherein the first conductor forms part of the vertically oriented junction diode.

10. The memory circuit of claim 4 wherein the second conductor is formed from the first metal layer.

11. The memory circuit of claim 10 wherein the first metal layer defines a bit line of the memory circuit.

12. The memory circuit of claim 4 wherein:
the vertically oriented junction diode comprises a vertically oriented polysilicon diode; and
at least one of the first and second conductors comprises a barrier/liner layer.

13. The memory circuit of claim 12 wherein the vertically oriented polysilicon diode comprises a p-i-n diode.

14. The memory circuit of claim 4 further comprising an antifuse layer disposed below the second conductor.

15. The memory circuit of claim 14 wherein the antifuse layer comprises at least one of silicon dioxide, silicon nitride and silicon oxynitride.

16. The memory circuit of claim 1 wherein the two-terminal memory element has a width of less than about 800 nanometers.

17. The memory circuit of claim 1 further comprising a plurality of two-terminal memory elements formed on the substrate and wherein each two-terminal memory element is formed between the gate layer and the first metal layer of the memory circuit.

18. The memory circuit of claim 17 wherein the two-terminal memory elements have a pitch of less than about 1.75 microns.

19. The memory circuit of claim 17 wherein each two-terminal memory element has a width of less than about 800 nanometers.

20. The memory circuit of claim 17 wherein each two-terminal memory element comprises a programmable read only memory (PROM) or a re-writable memory.

21. The memory circuit of claim 20 wherein each two-terminal memory element comprises a diode-based memory element.

22. The memory circuit of claim 21 wherein each diode-based memory element comprises:
a first conductor;
a second conductor formed above the first conductor; and
a vertically oriented junction diode disposed between the first and second conductors.

23. The memory circuit of claim 22 wherein the first conductor of each diode-based memory element is at a level of a gate layer of the CMOS transistor.

24. The memory circuit of claim 23 wherein the first conductor of each diode-based memory element is formed from the gate layer used to form the CMOS transistor.

25. The memory circuit of claim 22 wherein the second conductor of each diode-based memory element is formed from the first metal layer.

26. The memory circuit of claim 25 wherein the first metal layer defines a bit line of the memory circuit.

27. The memory circuit of claim 1 wherein the CMOS transistor comprises:
a well region;
an isolation region formed in the well region so as to form a first portion and a second portion of the well region;
a channel region formed adjacent to the first portion of the well region;
a gate dielectric layer formed over at least a portion of the isolation region, at least a portion of the channel region and the first portion of the well region;
a gate electrode formed on the gate dielectric;
a drain region formed in the second portion of the well region; and
a drain contact that extends from the drain region to the first metal layer of the memory circuit.

28. The memory circuit of claim 1 wherein the CMOS transistor comprises at least one extended lightly doped drain (LDD) region.

29. The memory circuit of claim 1 wherein the CMOS transistor is further adapted to program the two-terminal memory element to store data.

30. The memory circuit of claim 1, wherein the two-terminal memory element comprises a programmable read only memory (PROM) or a re-writable memory.

* * * * *